(12) United States Patent
Wallin et al.

(10) Patent No.: US 8,540,786 B2
(45) Date of Patent: Sep. 24, 2013

(54) METHOD FOR PRODUCING PVD COATINGS

(75) Inventors: Erik Wallin, Uppsala (SE); Ulf Helmersson, Rimforsa (SE)

(73) Assignee: Sandvik Intellectual Property AB, Sandviken (SE)

( * ) Notice: Subject to any disclaimer, the term of this patent is extended or adjusted under 35 U.S.C. 154(b) by 387 days.

(21) Appl. No.: 12/602,879

(22) PCT Filed: May 28, 2008

(86) PCT No.: PCT/EP2008/056528
§ 371 (c)(1),
(2), (4) Date: Mar. 18, 2010

(87) PCT Pub. No.: WO2008/148673
PCT Pub. Date: Dec. 11, 2008

(65) Prior Publication Data
US 2010/0183900 A1 Jul. 22, 2010

(30) Foreign Application Priority Data
Jun. 8, 2007 (SE) .......................... 0701435
Jun. 20, 2007 (SE) .......................... 0701525

(51) Int. Cl.
*C23C 14/08* (2006.01)
(52) U.S. Cl.
USPC ....... 51/307; 51/309; 204/192.1; 204/192.15; 204/192.16; 428/698; 428/699; 428/701; 428/702

(58) Field of Classification Search
USPC ............... 51/307, 309; 428/697, 698, 699, 428/701, 702; 204/192.1, 192.15, 192.16
See application file for complete search history.

(56) References Cited

U.S. PATENT DOCUMENTS

| | | | |
|---|---|---|---|
| 5,310,607 A | 5/1994 | Schulz et al. | |
| 5,698,314 A | 12/1997 | Goedicke et al. | |
| 6,296,742 B1 * | 10/2001 | Kouznetsov | 204/192.12 |
| 7,081,186 B2 * | 7/2006 | Ehiasarian et al. | 204/192.12 |
| 2007/0275179 A1 | 11/2007 | Astrand et al. | |
| 2009/0068450 A1 | 3/2009 | Muenz et al. | |
| 2009/0200158 A1 * | 8/2009 | Ehiasarian | 204/192.12 |

FOREIGN PATENT DOCUMENTS

| | | |
|---|---|---|
| CN | 1898406 A | 1/2007 |
| DE | 10 2005 033 769 | 1/2007 |
| EP | 0513662 A1 | 11/1992 |
| JP | 05-208326 | 8/1993 |
| JP | 10-140353 | 11/1996 |
| WO | WO-2006041366 A1 | 4/2006 |
| WO | 2007/053317 | 5/2007 |
| WO | 2007/054048 * | 5/2007 |

OTHER PUBLICATIONS

Konstantinidis et al., "Titanium oxide thin films deposited by high impulse magnetron sputtering", Thin Solid Films, vol. 515, Nov. 23, 2006, No. 3, p. 1182-1186.

(Continued)

*Primary Examiner* — Archene Turner
(74) *Attorney, Agent, or Firm* — Morgan, Lewis & Bockius LLP

(57) ABSTRACT

The present invention relates to a method of producing coatings of metal oxide, nitride or carbide or mixtures thereof, whereby operating a High Power Impulse Magnetron Sputtering, HIPIMS, discharged on one or more target(s) (3), in an argon and reactive gas mixture (5, 6), at peak pulse power higher than 200 $Wcm^{-2}$, in which the deposition rate is improved and in the need for partial reactive gas pressure feedback systems is eliminated.

26 Claims, 2 Drawing Sheets

(56) References Cited

OTHER PUBLICATIONS

Glocker et al., "High Power Pulsed Reactive Sputtering of Zirconium Oxide and Tantalum Oxide", 2004 Society of Vacuum Coaters, 47th Annular Technical Conference Proceedings (Apr. 24-29, 2004), Dallas, TX USA, p. 183-186.

Sproul, et al., "The Reactive Sputter Deposition of Aluminium Oxide Coatings Using High Power Pulsed Magnetron Sputtering (HPPMS)", 2004 Society of Vacuum Coaters, 47th Annular Technical Conference Proceedings (Apr. 24-29, 2004), Dallas, TX USA, p. 96-100.

F. Fietzke et al., "The deposition of hard crystalline $Al_2O_3$ layers by means of bipolar pulsed magnetron sputtering", Surface and Coatings Technology, 86-87 (1996), pp. 657-663.

A. P. Ehlasarian et al., "CrN Deposition by Reactive High-Power Density Pulsed Magnetron Sputtering", 45th Annual Technical Conference Proceedings (2002) ISSN 0737-5921, 2002 Society of Vacuum Coaters 505-856-7188, pp. 328-334.

Japanese Notice of Reasons for Rejection issued by the Japanese Patent Office on Jan. 8, 2013 in corresponding Japanese Patent Application No. 2010-510742 (with English translation).

\* cited by examiner

METHOD FOR PRODUCING PVD COATINGS

This application is the National Stage of International Application No. PCT/EP2008/056528, filed May 28, 2008, and claims benefit of Swedish Application Nos. 0701435-0, filed Jun. 8, 2007 and 0701525-8, filed Jun. 20, 2007.

The present invention relates to a High Power Impulse Magnetron Sputtering (HIPIMS) method with a high deposition rate.

Hard PVD coatings are frequently used for protection of underlying material from oxidation and wear. Such hard coatings may be deposited by PVD methods such as reactive magnetron sputtering. Using reactive sputtering gas gives rise to problems, because the desired material forms layers with different properties compared to a metallic surface, such as electrically insulating layers, on the target surface. Particularly, when the sputtering yield or electron emissivity of the reacted target surface is different from that of the metallic surface, hysteresis effects occur that make the process unstable.

Established PVD technology teaches how to reactively deposit hard coatings by means of dual magnetrons, Dual Magnetron Sputtering (DMS), and pulsed dc power, in order to avoid forming thick reacted layers on the targets. The problem with low sputtering yield from reacted target surfaces still remains; in order to obtain the desired compound a certain reactive gas partial pressure is required, but at the same time the target surface is covered by reactants as well. The result is the well know hysteresis problem which usually is overcome by a more or less complicated feedback system (pressure, optical or electrical) for controlling the reactive gas flow.

High power impulse magnetron sputtering (HIPIMS) has been used for the deposition of metallic coatings or conducting metal nitrides, e.g., CrN by reactive HIPIMS. $TiO_2$ has been grown from ceramic $TiO_{1.8}$ targets using HIPIMS and high rates were achieved. HIPIMS has been used for reactive sputtering of alumina but with the conventional hysteresis phenomena and oxygen flow feedback control, and with a deposition rate of only 25-30% compared to pulsed DC sputtering. Another issue is that when coatings of mixed metal oxides, nitrides, carbides or mixtures thereof, are deposited the different target metals react, and show hysteresis effects at different reactive gas partial pressures, making it difficult if not impossible to co-deposit mixed hard coatings.

It is also known how to operate a magnetron with an aluminium target, and a HIPIMS power supply, in a reactive Ar/oxygen mixture, to deposit an XRD amorphous alumina layer. Albeit the layer contains nanometer size gamma alumina grains, the microstructure is porous, making the deposited layer less suitable in many coating applications.

Deposition using HIPIMS techniques is described in Glocker et al., "High Power Pulsed Reactive Sputtering of Zirconium Oxide and Tantalum Oxide", 2004 Society of Vacuum Coaters 505/856-7188, ISSN 0737-5921, 47th Annular Technical Conference Proceedings (Apr. 24-29, 2004), Dallas, Tex. USA, p. 183-186, Konstantinidis et al., "Titanium oxide thin films deposited by high impulse magnetron sputtering", Thin Solid Films, vol. 515, 23 Nov. 2006, No. 3, p. 1182-1186, Sproul et al., "The Reactive Sputter Deposition of Aluminium Oxide Coatings Using High Power Pulsed Magnetron Sputtering (HPPMS)", 2004 Society of Vacuum Coaters 505/856-7188, ISSN 0737-5921, 47th Annular Technical Conference Proceedings (Apr. 24-29, 2004), Dallas, Tex. USA, p. 96-100, and Muenz et al., DE 10 2005 033 769-A1. However, the above mentioned problems still remain to be solved.

It is an object of the present invention to provide a method in which the deposition rate is higher and in which the need for partial reactive gas pressure feedback systems is eliminated. Furthermore, deposition of homogeneous coatings over a large surface is enabled, and with the invented method co-deposition of mixed metal oxides, nitrides, carbides or mixtures thereof, from targets of different metals or alloys is made possible.

Figure 1:
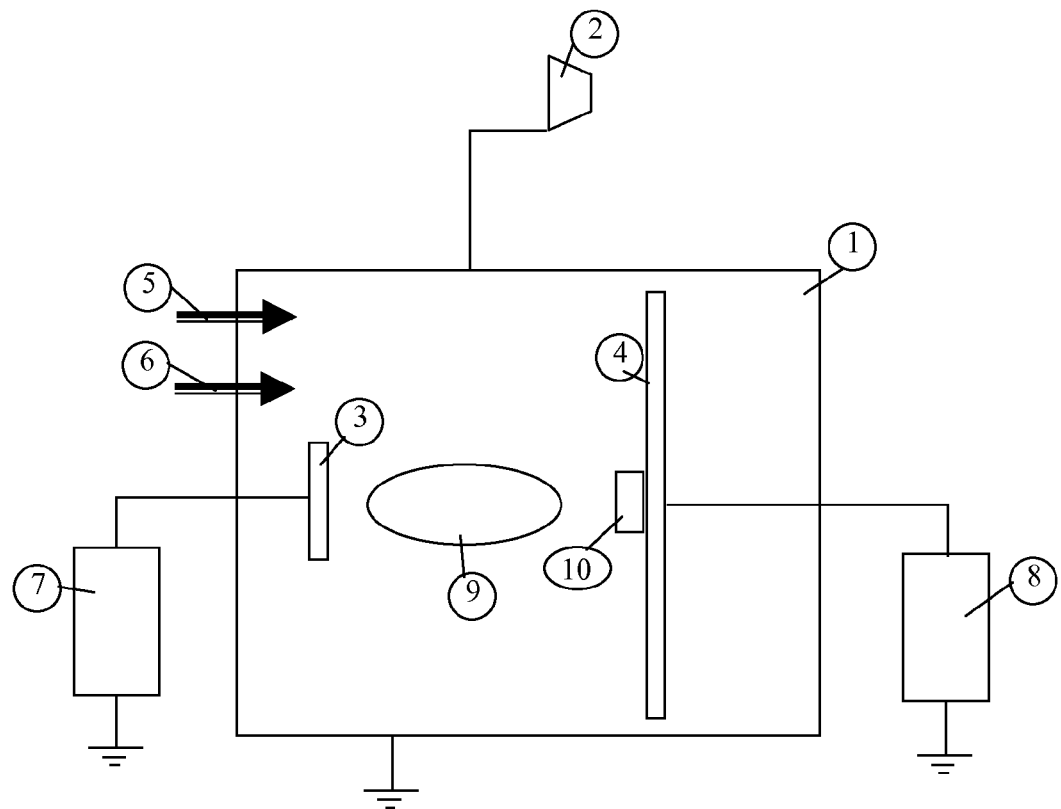
FIG. 1 shows a schematic view of a vacuum deposition system.

According to the present invention there is provided a magnetron sputtering method for producing coatings of mixed metal oxides, nitrides, carbides or mixtures thereof, especially coatings comprising aluminium oxide, on, e.g., tools for cutting and forming, metallic sheets, and components for the purpose of, e.g., surface engineering, decoration and surface protection. The method applied on the deposition of a coating on a cutting tool insert is preformed according to the following, reference is made to FIG. 1:

A substrate of a hard material, such as cemented carbide, cermet, cubic boron nitride, diamond, ceramic or high speed steel, preferably cemented carbide, is provided, onto which is deposited a well adherent hard and wear resistant coating using magnetron sputtering, for growing, suitably stoichiometric crystalline, coatings of metal oxides, nitrides, carbides or mixtures thereof, whereby the deposition is based on simultaneously having reactive conditions at the substrate, whilst maintaining the target surface in an essentially metallic state. This means that the target surface has not reacted with the reactive gas to the extent that it has inflicted hysteretic process behaviour at the selected working point. This is achieved by operating a HIPIMS discharge on one or more target(s) (3), in a gas mixture comprising argon and a reactive gas, at a peak pulse power higher than 200 $Wcm^{-2}$, preferably at least 320 $Wcm^{-2}$, and preferably at a total pressure of 15 mTorr or lower, more preferably 10 mTorr or lower, most preferably 6 mTorr or lower. Upon determining the stoichiometry of the obtained layer and reactive gas coverage of the sputtering target it is surprisingly found that full stoichiometry of the layer is achieved at conditions under which the target is insignificantly covered by reactive gas.

It is furthermore surprisingly found that the hysteresis effects are reduced or eliminated, therefore not reducing the deposition rates, as is the case of pulsed DC sputtering. Consequently, the need for partial reactive gas pressure feedback systems is eliminated. In the absence of hysteresis at the working point, the process can be operated in a stable mode with well defined characteristic parameters for each selected value of oxygen flow.

In HIPIMS the high peak pulse power renders the ion density of sputtered atoms very high, therefore sputtering is performed by target metal ions, which leads to a lower deposition rate in HIPIMS. Surprisingly the rate achieved by applying the invented method is at least 3 times higher compared to prior art.

Cutting tools of suitable types, provided as substrates, may be coated, in a vacuum chamber, with a metal oxide coating according to the following embodiment of the invention:

After subjecting the substrates (10) to standard cleaning procedures they are mounted on a substrate holder (4) operable to rotate during deposition, wherein the deposition area, i.e. the sum of the exposed surfaces of the substrate holder (4)

and the substrates (10) mounted thereon, is preferably at least 10 times the sum of the area(s) of the one or more target(s), preferably 10-25 times the sum of the area(s) of the one or more target(s), preferably with a minimum distance of 6 cm, more preferably between 8 and 20 cm from at least one magnetron sputter source with a target (3). The substrate holder (4) is either electrically floating, grounded or connected to an optional bias power supply (8), with dc or ac or pulsed dc operation mode, according to what is common practice for someone skilled in the art. The material of the target (3) is selected according to the metal composition of the desired coating. The type of magnetron source onto which the target (3) is mounted may be any standard commercial or special design, with balanced or unbalanced or adjustable magnet systems, and its shape may, for instance, be circular or rectangular.

Deposition is carried out in the vacuum chamber (1), which is first evacuated by a high vacuum pump (2) to below $5 \times 10^{-4}$ Torr, preferably below $5 \times 10^{-6}$ Torr. Before the deposition the substrate (10) is preferably heated to a temperature of between 300-900° C., preferably 450-700° C., most preferably 570-630° C. Ar is used as sputtering gas, which is let into the chamber (1) through a first valve or mass flow controller (5). A constant Ar flow is used, rendering a chamber pressure of 15 mTorr or lower, preferably 1-10 mTorr, most preferably 3-8 mTorr. The deposition is initiated preferably in pure Ar sputtering gas, but may also start in conjunction with, or even after introducing oxygen in the system through a second valve or a mass flow controller (6). The oxygen gas ($O_2$) is introduced at a constant flow, which is maintained during the deposition. In case of initiation in pure Ar sputtering gas, the oxygen gas ($O_2$) is preferably introduced after a delay of less than 10 minutes, more preferably 1-3 minutes. The oxygen gas ($O_2$) flow is chosen so that stoichiometric oxides are obtained, which flow is dependant on the deposition system characteristics, such as, e.g., the target size, and pumping speed. The appropriate oxygen flow value is empirically determined by the skilled artisan, by adjusting the flow value according to measurements of the coating oxygen stoichiometry. However, for normal size production systems, oxygen gas ($O_2$) flow of 200-1000 sccm, may be used.

The deposition is started by applying negative voltage pulses, generated by a power supply (7), in the range of 200 V, preferably 500 V, most preferably 650 V, to 2000 V, preferably 1000 V, most preferably 750 V, to the target relative to the anode (the vacuum chamber walls). The pulse length is in the range of 2 µs, preferably 10 µs, most preferably 20 µs, to 200 µs, preferably 100 µs, more preferably less than 100 µs, more preferably less than 75 µs, most preferably 40 µs, and the repetition frequency is in the range of 100 Hz, preferably 300 Hz, most preferably 500 Hz, to 10 kHz, preferably 3 kHz, most preferably 1.5 kHz. The power supply (7) comprises a pulsing unit fed with a preferably constant DC voltage source or most preferably an integrated pulsed dc power supply, suitable to the purpose. The pulses, preferably having a constant voltage, ignite a magnetron sputtering glow discharge (9) with a current rising to a maximum peak during each pulse, at which the peak pulse power is reached. After reaching maximum the current is constant or drops to a minimum 50% of the peak value. Preferably the current maximum is, however, reached at the end of the voltage pulse. In between two consecutive pulses there is no electric power input to the deposition system, therefore the plasma decays by ion/electron recombination. The time between pulses is selected by the operator skilled in the art, so that the glow discharge is preferably never extinguished. Furthermore, the peak current pulse maximum, length, and repetition frequency is selected high enough, i.e. according the limits given above, so that hysteresis effects with respect to oxygen flow in characteristic parameters, e.g., deposition rate, target voltage, optical emission and coating as well as target oxide coverage, are reduced or eliminated.

The deposition is continued for a suitable period of time, after which the inserts are left to cool below 200° C., and removed from the vacuum system.

In one embodiment of the method the area of the target (3) is 1000-2000 cm$^2$, and the substrate holder (4) area is 10000-20000 cm$^2$. For the alternative embodiment the maximum sputter current is 980-2800 A, preferably 1120-1680 A, and a maximum instantaneous power of from 200 kW, preferably 320 kW, to 2000 kW, preferably 4000 kW.

In another embodiment of the method there is provided more than one magnetron sputtering source with targets, and these targets may have metal compositions being the same or differing from each other.

In one embodiment the one or more targets are of the same metal composition being an AlMe alloy, where Me is one or more of the metals of the group Mg, Zn, Mn, Fe, Co, Ni, Zr, Cd, Cu, Cr and Sn and the gas mixture in the vacuum chamber is a mixture of Ar and oxygen gas ($O_2$), whereby the deposited coating comprises a two phase oxide, or a mixed oxide of the type $(Al_{1-x}Me_x)_2O_3$ or spinel $(Me)_xAl_2O_{3+x}$ ($0<x\leq1$). Preferably the one or more targets of the same metal composition are of Al, whereby the deposited coating comprises a crystalline phase of alumina, more specifically gamma or alpha alumina, deposited to a thickness of preferably 0.1-30 µm, more preferably 1-10 µm, most preferably 2-5 µm. Most preferably the deposited coating comprises single phase alpha-alumina.

In one further embodiment of the method two or more targets, having metal compositions differing from each other, and a gas mixture of Ar and oxygen gas ($O_2$) is used, whereby a multilayer or mixed oxide of the type $(Al_{1-x}Me_x)_2O_3$ or spinel $(Me)_xAl_2O_{3+x}$ ($0<x\leq1$), or a two phase oxide is deposited.

In one alternative embodiment of the invention cutting tools of suitable types, provided as substrates, may be coated, in a vacuum chamber (1), with a metal oxide, nitride, carbide or mixtures thereof by proceeding as described in the first embodiment of the invented method, but, instead of using only oxygen, using a reactive gas mixture comprising oxygen, nitrogen and/or carbon containing gases, such as, oxygen, nitrogen or a nitrogen and hydrocarbon gas mixture. In this alternative embodiment the one or more targets are of the same metal composition being an AlMe alloy, where Me is one or more of the metals of the group Ti, V, Cr, Zr, Nb, Mo, Hf, Ta, and W. In this alternative embodiment the deposition is initiated in pure Ar sputtering gas but may also start in conjunction with, or even after, introducing the reactive gas through the second valve or mass flow controller (6). In the case of initiation in pure Ar sputtering gas, the reactive gas is preferably introduced after a delay of less than 10 minutes, more preferably 1-3 minutes. The reactive gas composition is selected according to what a person skilled in the art would choose to obtain coatings with a desired oxygen/nitrogen/carbon balance. The reactive gas flows are selected by the skilled artisan, so that stoichiometric coatings of oxides, nitrides, carbides or mixtures thereof are obtained, which flow is dependant on the deposition system characteristics, such as, e.g., the target size, pumping speed. However, for normal size production systems, a total reactive gas flow of 200-1000 sccm, may be used.

In one further alternative embodiment two or more targets have a metal composition differing from each other, whereby mixed or multilayered AlMe coatings of oxide, nitride, carbide or mixtures thereof are obtained, where Me is one or more of the metals of the group Ti, V, Cr, Zr, Nb, Mo, Hf, Ta, and W.

In between and on top of the coating of metal oxide, nitride, carbide or mixtures thereof, other layers of wear resistant oxides, carbides or nitrides or mixtures thereof may be deposited, by the invented method, or by methods as known in the art. One example is a top layer of TiN used for wear detection of a cutting tool.

According to the present invention there is also provided coatings of oxide, nitride, carbide or mixtures thereof comprising aluminium oxide, suitable for, e.g., tools for cutting and forming, metallic sheets, and components for the purpose of, e.g., surface engineering, decoration and surface protection wherein the deposition of a coating on a cutting tool insert is preformed according to the following, reference is made to FIG. 1:

A substrate of a hard material, such as cemented carbide, cermet, cubic boron nitride, diamond, ceramic or high speed steel, preferably cemented carbide, is provided, onto which is deposited a well adherent hard and wear resistant coating using magnetron sputtering, for growing stoichiometric crystalline coatings of oxides, nitrides, carbides or mixtures thereof, whereby the deposition is based on simultaneously having reactive conditions at the substrate, whilst maintaining the target surface in an essentially metallic state. This is achieved by operating a HIPIMS discharge on one or more target(s) (3), in a gas mixture comprising argon and a reactive gas, at a peak pulse power higher than 200 Wcm$^{-2}$, preferably at least 320 Wcm$^{-2}$, and at a total pressure of 15 mTorr or lower, preferably 10 mTorr or lower, most preferably 6 mTorr or lower, and at a high enough repetition frequency. Upon determining the stoichiometry of the obtained layer and reactive gas coverage of the sputtering target it is surprisingly found that full stoichiometry of the layer is achieved at conditions under which the target is insignificantly covered by reactive gas.

In one embodiment the one or more targets are of the same metal composition being an AlMe alloy, where Me is one or more of the metals of the group Mg, Zn, Mn, Fe, Co, Ni, Zr, Cd, Cu, Cr and Sn, and the gas mixture in the vacuum chamber is a mixture of Ar and oxygen gas ($O_2$), whereby the deposited coating comprises a mixed oxide of the type $(Al_{1-x}Me_x)_2O_3$ or spinel $(Me)_xAl_2O_{3+x}$ ($0<x\leq 1$), or a two phase oxide. Preferably the one or more targets of the same metal composition are of Al, whereby the deposited coating comprises a crystalline phase of alumina, more specifically gamma or alpha alumina, deposited to a thickness of preferably 0.1-30 µm, more preferably 1-10 µm, most preferably 2-5 µm. Most preferably the deposited coating comprises single phase alpha-alumina.

In one further embodiment of the method two or more targets, having metal compositions differing from each other, and a gas mixture of Ar and oxygen gas ($O_2$) is used, whereby a multilayer or mixed oxide of the type $(Al_{1-x}Me_x)_2O_3$ or spinel $(Me)_xAl_2O_{3+x}$ ($0<x\leq 1$), or a two phase oxide is deposited.

In one alternative embodiment the one or more targets are of the same metal composition being an AlMe alloy, where Me is one or more of the metals of the group Ti, V, Cr, Zr, Nb, Mo, Hf, Ta, and W, and the gas mixture in the vacuum chamber is a mixture of Ar and reactive gas comprising oxygen, nitrogen and/or carbon containing gases, such as, oxygen or nitrogen or a nitrogen and hydrocarbon gas mixture, whereby the deposited coating comprises a cubic AlMe(C,N,O) coating. Preferably the one or more targets of the same metal composition are of AlTi, whereby the deposited coating comprises a crystalline phase of AlTi(C,N) having the NaCl-structure, and deposited to a thickness of preferably 0.1-30 µm, more preferably 1-10 µm, most preferably 2-5 µm. Most preferably the one or more targets of the same metal composition are of Ti, whereby the deposited coating comprises Ti(C,N).

In one further alternative embodiment two or more targets have a metal composition differing from each other, whereby mixed or multilayered AlMe coatings of oxide, nitride, carbide or mixtures thereof are obtained, where Me is one or more of the metals of the group Ti, V, Cr, Zr, Nb, Mo, Hf, Ta, and W.

In between and on top of the metal oxide, nitride, carbide, or mixtures thereof coating, other layers of wear resistant oxides, carbides or nitrides or mixtures thereof may be deposited, by the invented method or by methods as known in the art. An example of a further coating is a TiN top layer used for wear detection of a cutting tool.

EXAMPLE 1

A cutting tool insert of commercial grade H10F of composition WC10% Co and insert style SNUN1204 (12×12×4 mm size), was coated in an ultra high vacuum deposition system, see FIG. 1, according to the following. The insert (10) was cleaned using standard procedures and mounted on a substrate holder (4), operable to rotate during deposition, having an area of 200 cm$^2$, at a position about 10 cm above a magnetron sputter target (3). The substrate holder (4) was electrically floating. The target (3) was an Al disc with a diameter of 50 mm, and a thickness of 3 mm. Deposition was carried out in a vacuum chamber (1) which was first evacuated to $5\times 10^{-7}$ Torr. Before the deposition started the insert (10) was heated to an approximate surface temperature of 600° C. Ar was used as sputtering gas, which was let into the chamber (1) through a first mass flow controller (5). A constant flow of 100 sccm argon was used which resulted in a total pressure in the chamber (1) of 6 mTorr.

The deposition was started by applying negative voltage pulses of 700 V to the target (3) relative to the anode (the chamber walls). The pulse length was 35 µs and the repetition frequency 1 kHz. For this purpose a power supply (7) was used, comprising a pulsing unit (SPIK, Melec Gmbh) fed with a constant DC voltage source (Pinnacle, Advanced Energy). The resultant pulses with a constant voltage ignited a magnetron sputtering glow discharge (9) with a current rising to a maximum during the pulse. The deposition was initiated in pure Ar sputtering gas, introduced through a first mass flow controller (5). After about 2 minutes after the start of the deposition, oxygen gas ($O_2$) was introduced through a second mass flow controller (6) at a constant flow rate of 3.4 sccm. Since the deposition was carried out in a system without hysteresis the process could be operated in a stable mode with a well defined maximum sputtering current in the pulses for the selected value of oxygen flow. The voltage and oxygen flow selected for this particular deposition run imparted a time averaged power of 110 W. For these conditions the maximum sputter current was determined to 9.1 A, i.e. a maximum instantaneous power of 6.4 kW. The deposition was continued for 3 h, after which the insert was left to cool below 200° C., before being removed from the vacuum system.

Figure 2:
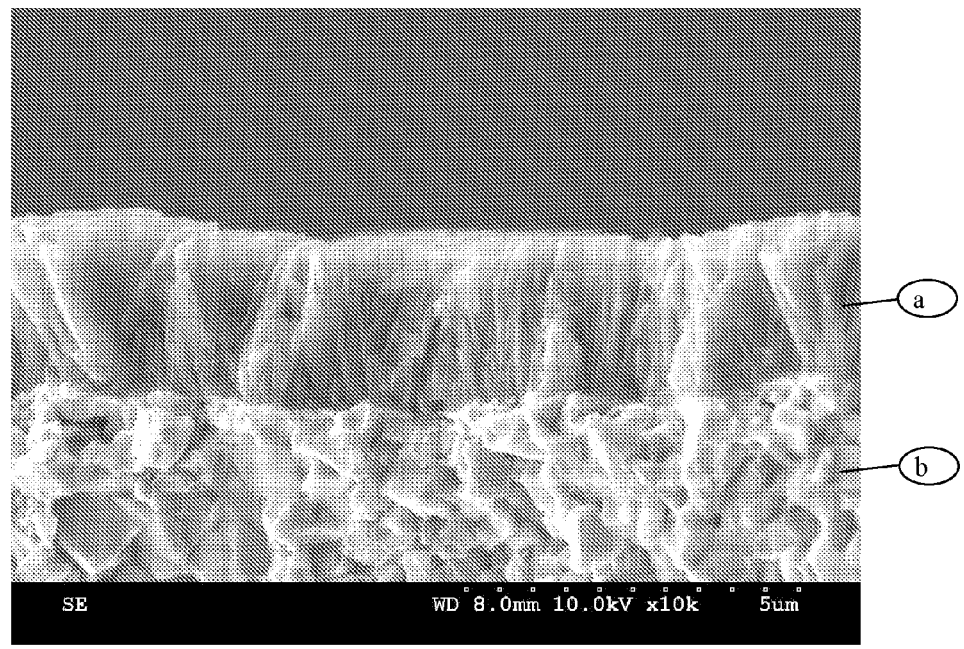
FIG. 2 shows a Scanning Electron Microscope micrograph of a coated insert according to one embodiment of the present invention.
Figure 3:
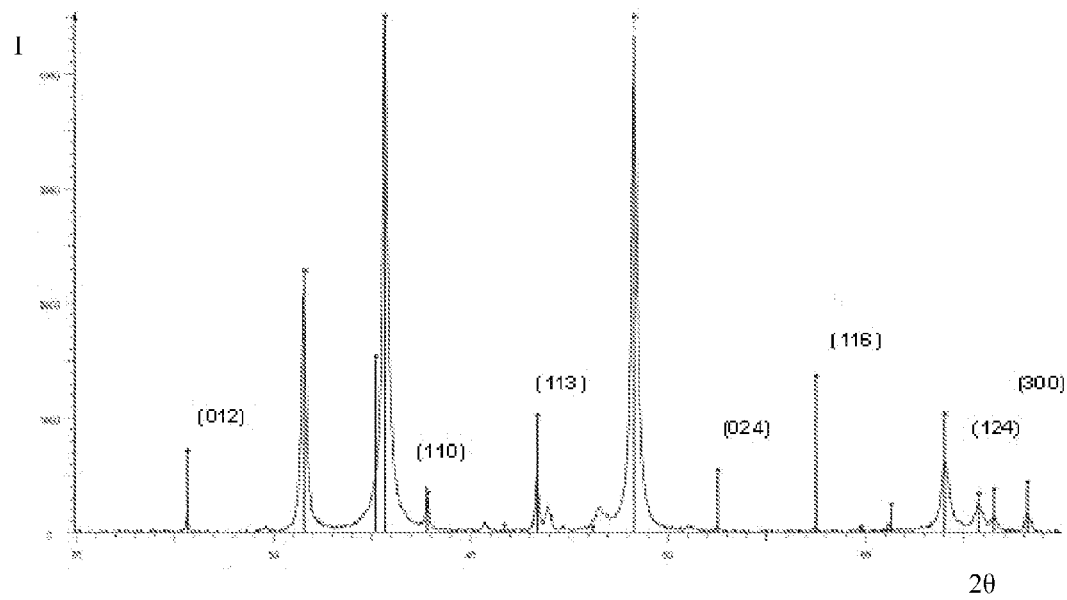
FIG. 3 shows an X-ray diffractogram from a coated insert according to one embodiment of the present invention.

Analysis of the insert showed in FIG. 2, revealed that the coating (a) on the substrate (b) consisted of a well adherent aluminium oxide layer, transparent in the visible optical range and with a thickness of 2.0 µm, corresponding to a deposition rate of 0.67 μm/h, c.f. Table 1. The coating was found to comprise one stoichiometric crystalline phase, alpha-$Al_2O_3$, identified by at least 5 peaks as is shown in the X-ray diffractogram in FIG. 3. All other peaks than the designated as alpha originate in the substrate.

TABLE 1

| Method | Deposition rate (μm/h) |
|---|---|
| Invention | 0.67 |
| Prior art HIPIMS | 0.17-0.21 |
| DMS | 0.33 |

From Table 1 it can be seen that the deposition rate when using the method according the present invention is at least 3 times higher compared to prior art. The deposition rate for DMS is included for comparison.

The invention claimed is:

1. Method for depositing a coating of crystalline metal oxide, nitride or carbide or mixtures thereof, comprising operating a High Power Impulse Magnetron Sputtering, HIPIMS, discharge on one or more target(s), in a mixture of argon and a reactive gas, at a peak pulse power higher than 200 $Wcm^{-2}$, a pulse length up to 100 μs and a repetition frequency from 100 Hz.

2. Method according to claim 1, wherein the deposition is started by applying negative voltage pulses, generated by a power supply, in the range of 200 V to 2000 V to the target relative to the anode.

3. Method according to claim 1, wherein the pulse length is 2 μs to 40 μs.

4. Method according to claim 1, wherein the repetition frequency is 300 Hz to 10 kHz.

5. Method according to claim 1, comprising using a power supply comprising a pulsing unit fed wherein the pulses ignite a magnetron sputtering glow discharge with a current rising to a maximum peak during each pulse, at which the peak pulse power is reached, where after the current is constant or drops to a minimum 50% of the peak value.

6. Method according to claim 1, wherein a total pressure is 15 mTorr or lower.

7. Method according to claim 1, wherein said coating is deposited on a cutting tool.

8. Method according to claim 1, wherein said coating comprises a crystalline oxide layer, as measured by X-ray diffraction.

9. Method for depositing a coating of crystalline metal oxide, nitride or carbide or mixtures thereof, comprising operating a High Power Impulse Magnetron Sputtering, HIPIMS, discharge on one or more target(s), in a mixture of argon and a reactive gas, at a peak pulse power higher than 200 $Wcm^{-2}$, a pulse length up to 100 μs and a repetition frequency from 100 Hz, wherein said coating comprises a two phase oxide, or a mixed oxide of the type $(Al_{1-x}Me_x)_2O_3$ or spinel $(Me)_xAl_2O_{3+x}$, where $0<x\leq1$ and where Me is one or more of the metals of the group Mg, Zn, Mn, Fe, Co, Ni, Zr, Cd, Cu, Cr and Sn.

10. Method according to claim 8, wherein said oxide coating comprises a crystalline alpha-$Al_2O_3$ layer, as measured by X-ray diffraction.

11. A cutting tool comprising a substrate of a hard material and a coating of oxide, nitride or carbide or mixtures thereof, wherein said coating is deposited by operating a High Power Impulse Magnetron Sputtering, HIPIMS, discharge on one or more target(s), in a mixture of argon and a reactive gas, at peak pulse power higher than 200 $Wcm^{-2}$, a pulse length of up to 100 μs and a repetition frequency from 100 Hz.

12. A cutting tool according to claim 11, wherein said coating comprises a crystalline oxide layer, as measured by X-ray diffraction.

13. A cutting tool comprising a substrate of a hard material and a coating of oxide, nitride or carbide or mixtures thereof, wherein said coating is deposited by operating a High Power Impulse Magnetron Sputtering, HIPIMS, discharge on one or more target(s), in a mixture of argon and a reactive gas, at peak pulse power higher than 200 $Wcm^{-2}$, a pulse length of up to 100 μs and a repetition frequency from 100 Hz, wherein said coating comprises a two phase oxide, or a mixed oxide of the type $(Al_{1-x}Me_x)_2O_3$ or spinel $(Me)_xAl_2O_{3+x}$, where $0<x\leq1$ and where Me is one or more of the metals of the group Mg, Zn, Mn, Fe, Co, Ni, Zr, Cd, Cu, Cr and Sn.

14. A cutting tool according to claim 12, wherein said oxide coating comprises a crystalline alpha-$Al_2O_3$ layer, as measured by X-ray diffraction.

15. Method according to claim 2, wherein the deposition is started by applying negative voltage pulses, generated by the power supply, in the range of 500 V to 1000 V, to the target relative to the anode.

16. Method according to claim 15, wherein the deposition is started by applying negative voltage pulses, generated by the power supply, in the range of 6500 V to 750 V, to the target relative to the anode.

17. Method according to claim 3, wherein the pulse length is of 10 μs to 40 μs.

18. Method according to claim 17, wherein the pulse length is of 20 μs to 40 μs.

19. Method according to claim 4, wherein the repetition frequency is 500 Hz to 10 kHz.

20. Method according to claim 19, wherein the repetition frequency is 500 Hz to 3 kHz.

21. Method according to claim 20, wherein the repetition frequency is 500 Hz to 1.5 kHz.

22. Method according to claim 4, wherein the repetition frequency is 300 Hz to 3 kHz.

23. Method according to claim 22, wherein the repetition frequency is 300 Hz to 1.5 kHz.

24. Method according to claim according to claim 6, wherein a total pressure is 10 mTorr or lower.

25. Method according to claim 24, wherein a total pressure is 6 mTorr or lower.

26. A cutting tool comprising a substrate of a hard material and a coating of oxide, nitride or carbide or mixtures thereof, wherein said coating is deposited by the method of claim 1.

* * * * *